United States Patent
Lakrout et al.

(10) Patent No.: US 9,605,161 B2
(45) Date of Patent: *Mar. 28, 2017

(54) CONDUCTIVE CARBONIZED LAYERED ARTICLE

(71) Applicant: Blue Cube IP LLC, Midland, MI (US)

(72) Inventors: Hamed Lakrout, Lake Jackson, TX (US); Maurice J. Marks, Lake Jackson, TX (US); Ludovic Valette, Perrysburg, OH (US)

(73) Assignee: BLUE CUBE IP LLC, Midland, MI (US)

( * ) Notice: Subject to any disclaimer, the term of this patent is extended or adjusted under 35 U.S.C. 154(b) by 128 days.

This patent is subject to a terminal disclaimer.

(21) Appl. No.: 14/391,714

(22) PCT Filed: May 17, 2013

(86) PCT No.: PCT/US2013/041558
§ 371 (c)(1),
(2) Date: Oct. 10, 2014

(87) PCT Pub. No.: WO2013/188048
PCT Pub. Date: Dec. 19, 2013

(65) Prior Publication Data
US 2015/0111028 A1    Apr. 23, 2015

Related U.S. Application Data

(60) Provisional application No. 61/660,469, filed on Jun. 15, 2012.

(51) Int. Cl.

| | | |
|---|---|---|
| *C09D 5/24* | (2006.01) | |
| *C04B 35/524* | (2006.01) | |
| *C08J 3/00* | (2006.01) | |
| *C08L 63/00* | (2006.01) | |
| *C04B 35/626* | (2006.01) | |
| *C04B 35/634* | (2006.01) | |
| *H01B 1/24* | (2006.01) | |
| *B82Y 10/00* | (2011.01) | |
| *H01B 1/04* | (2006.01) | |
| *C03C 17/22* | (2006.01) | |
| *H01L 51/00* | (2006.01) | |
| *H01L 51/44* | (2006.01) | |

(52) U.S. Cl.
CPC ............... *C09D 5/24* (2013.01); *B82Y 10/00* (2013.01); *C03C 17/22* (2013.01); *C04B 35/524* (2013.01); *C04B 35/6269* (2013.01); *C04B 35/63452* (2013.01); *C08J 3/00* (2013.01); *C08L 63/00* (2013.01); *H01B 1/04* (2013.01); *H01B 1/24* (2013.01); *C03C 2217/28* (2013.01); *C04B 2235/9653* (2013.01); *H01L 51/0045* (2013.01); *H01L 51/442* (2013.01); *Y10T 428/265* (2015.01)

(58) Field of Classification Search
CPC ....... C09D 5/24; C03C 17/22; C03C 2217/28; H01B 1/04; H01B 1/24; B82Y 10/00; C04B 35/6269; C04B 35/63452; C04B 35/524; C04B 2235/9653; C08L 63/00; C08J 3/00; Y10T 428/465; H01L 51/0045; H01L 51/442

See application file for complete search history.

(56) References Cited

U.S. PATENT DOCUMENTS

| 5,318,303 | A | * | 6/1994 | Kim | ...................... A63B 67/02 473/160 |
|---|---|---|---|---|---|
| 5,776,633 | A | * | 7/1998 | Mrotek | .................... C25B 11/12 204/291 |
| 2008/0297980 | A1 | * | 12/2008 | Bourcier | ............. C02F 1/46109 361/502 |

(Continued)

FOREIGN PATENT DOCUMENTS

EP    1063196 B8    2/2008

OTHER PUBLICATIONS

Inagaki, M., et al.; Materials Science and Engineering of Carbon Fundamentals, 2014, p. 82-92.*
Porter, Measurements: Optically Transparent Carbon Electrodes, Analytical Chemistry, Jan. 2008, pp. 14-22, Issue 1.
DeAngelis, Analytical Chemistry, Aug. 1977, pp. 1395-1398, vol. 49, No. 9.
Chen et al., Analytical Chemistry, (1996), pp. 3958-3965, vol. 68, No. 22.
McCreery, Chemical Reviews, 2008, pp. 2646-2687, vol. 108, No. 7.
Kummer et al., Analytical Chemistry, (1993), pp. 3720-3725, vol. 65, No. 24.
Sorrels et al., Analytical Chemistry, (1993), pp. 1640-1643, vol. 62, No. 15.

(Continued)

*Primary Examiner* — Robert Jones, Jr.
(74) *Attorney, Agent, or Firm* — Polsinelli PC

(57) ABSTRACT

A process for preparing a conductive carbonized layered article including the steps of: (I) providing a liquid carbon precursor formulation comprising (a) at least one aromatic epoxy resin; and (b)(i) at least one aromatic co-reactive curing agent, (b) (ii) at least one catalytic curing agent, or (b)(iii) a mixture thereof; wherein the liquid precursor composition has a neat viscosity of less than 10,000 mPa-s at 25° C. prior to adding optional components, prior to curing, and prior to carbonizing; and wherein the liquid precursor composition being cured has a carbon yield of at least 35 weight percent disregarding the weight of the substrate and any optional components present in the composition; (II) applying the liquid formulation of step (I) as a thin coating layer onto at least a portion of the surface of a substrate; (III) curing the liquid formulation of step (II) to form a cured product, wherein the cured product has a carbon yield of at least 35 weight percent disregarding the weight of the substrate and any optional components present in the composition; and (IV) carbonizing the cured product of step (III) to form a conductive carbonized layered article; and a conductive carbonized layered article such as a carbon optical transparent electrode (COTE) prepared by the above process.

14 Claims, No Drawings

(56) References Cited

U.S. PATENT DOCUMENTS

2010/0187482 A1  7/2010  Mullen et al.

OTHER PUBLICATIONS

J. Mattson et al., Analytical Chemistry, (1975), pp. 1122-1125, vol. 47, No. 7.
Anjo et al., Analytical Chemistry, (1993), pp. 317-319, vol. 65, No. 3.
Donner et al., Analytical Chemistry, (2006), pp. 2816-2822, vol. 78, No. 8.
Lee et al., Appl. Mater. Interfaces, 2009, pp. 927-933, vol. 1, No. 4.
Schreiber, Applied Surface Science, Aug. 15, 2010, pp. 6186-6190, vol. 256, Issue 21.

\* cited by examiner

CONDUCTIVE CARBONIZED LAYERED ARTICLE

FIELD

The present invention is related a conductive carbonized layered article and a process for manufacturing the conductive carbonized layered article.

BACKGROUND

In many electro-optical or photoelectric devices, it is necessary to transmit a charge through a coating or to dissipate an electric current. In these applications, a transparent conductive coating is used. For example, transparent conductive coatings are an essential element in liquid crystal displays, panel displays, photovoltaic cells, electrochromic devices, electroluminescent lamps and flat panel televisions or spectroelectrochemical analytical devices.

According to Porter, "Measurements: Optically Transparent Carbon Electrodes", *Analytical Chemistry*, January, issue 1, pp. 14-22 (2008), the most common transparent conductive electrode material for electro-optical devices and photovoltaics is indium tin oxide (ITO) and zinc Oxide ZnO. ITO is an opaque semiconductor that must be applied in thin layers (e.g. layers having a thickness of about 0.1 microns or less) to remain transparent. Indium is a very expensive metal and there is a potential shortage in the world's supply. Broader usage of optical flat panels and screens requires new and more reliable conductive coating. In spectro-electrochemistry applications, a flat electrode can serve for reductive or oxidative reactions in a liquid media or as an optically transparent window for Ultraviolet visible (UV-vis) or Infrared (IR) light spectroscopy. Few carbon materials have been used as optically transparent conductors (OTEs) in spectroelectrochemistry According to DeAngelis in Analytical Chemistry, Vol. 49, No. 9, pp. 1395-1398, August (1977), carbon materials combine four attractive features useful in these types of application, for example:

(1) A wide electrical potential window which extends into both the positive and negative regions of the potential versus a saturated calomel electrode. The carbon electrode exhibits low residual current throughout a variation of the potential between −1V and 1V in aqueous media (pH 10 carbonate-borate buffer, 0.5 M KNO) at a scan rate of 20 mV/s. The carbon film appears to be very stable under conditions of repeated potential cycling in aqueous media of varying pH.

(2) A good electrochemical activity measured as the electron transfer rate constant $k_s$ or $k^0$ being higher than $5.0 \times 10^{-5}$ cm/s for a range of redox systems. Of particular relevance to the current review are oxidations and reductions of organic and biological molecules in both aqueous and non-aqueous media, for which the electrochemical properties of carbon electrodes are often superior to those of noble metals (McCreery, Chemical Reviews, 2008, Vol. 108, No. 7, p. 2646).

(3) A chemical stability (relatively inert carbon surfaces do not react with other chemicals when placed in contact with each other) under strongly acidic (e.g., acidity is measured by the pH value, pH from 0 to 7 is acidic and a pH of from 7 to 14 is basic, a pH of 5 or below is strongly acidic) and alkaline conditions.

(4) A wide array of well-known strategies for surface modification for instance Chen et al., Analytical Chemistry, Vol. 68, No. 22, pp. 3958-3965 (1996), reports that "various well-established and novel surface modification procedures were used on glassy carbon (GC) electrodes to yield surfaces with low oxide content or which lack specific oxide functional groups." Furthermore, McCreery, Chemical Reviews, 2008, Vol. 108, No. 7, pp. 2646-2687, reports that new approaches to surface modification based on radical and photochemical reaction such as electrochemical reduction of phenyl diazonium reagents, oxidation of primary amines to a radical, or cycloaddition chemistry have significantly broadened the utility of carbon electrodes by providing very stable surface modifications.

However the design of a carbon film-based OTE involves a trade-off between optical transparency and electric resistivity, both of which are functions of the film thickness. According to US 20100187482 A1: low electrical resistance and high optical transparency are oppositely influenced by the film thickness.

A number of chemistries and processes have been tested for the past decades. For example, Kummer et al., Analytical Chemistry, Vol. 65, No. 24, pp. 3720-3725 (1993), investigated the preparation of a carbon optically transparent electrode by the deposition of thin films of carbon onto metal mesh substrates. Carbon coatings were produced by either spray coating Acheson DAG® 40 colloidal graphite suspended in butyl acetate onto a metal mesh at room temperature or by pyrolysis of acetone on a resistively heated metal mesh. The mesh provided the transparency of the electrode.

In the case of Sorrels et al., Sorrels, Analytical Chemistry, Vol. 62, No 15, pp. 1640-1643 (1993), a thick (0.5 to 3.5 mm) a reticulated vitreous carbon electrode (fabricated by Electroanalysis, Inc.) is sliced from a porous, vitreous carbon foam material. Further, Mattson et al., J. Mattson et al., Analytical Chemistry Vol. 47 No. 7, pp. 1122-1125 (1975), uses ultra high purity glassy carbon that is evaporated using an electron beam technique and deposited on glass and quartz substrates to make carbon optically transparent electrode.

According to Anjo, Anjo et al., Analytical Chemistry, Vol. 65, No. 3, pp. 317-319 (1993), carbon films are attractive because the film is deposited directly on the optical components; this places the electrode directly on the optical window and does not take up volume in the electrochemical cell. Anjo prepares a carbon film on a quartz substrate by a vacuum pyrolysis of 3, 4, 9, 10-perylenetetracarboxylic dianhydride. The carbon source 3, 4, 9, 10-perylenetetracarboxylic dianhydride is sublimed and then vapor-pyrolized at 800° C. on the surface of a quartz substrate producing a mirror-like conductive coating with a transmittance varying between 1% and 32% depending on the duration of the deposition.

EP1063196 (2008) discloses a carbonaceous complex structure comprising a layered set of a substrate, a carbonaceous thin film and a fullerene thin film. The film is obtained by thermally decomposing a carbon compound such as fullerene molecules or organic solvents, such as ethanol or toluene. The conductivity of the carbonaceous film is in the order of 0.01 S/cm. Such a low conductivity is not suitable for a transparent electrode in optoelectronic devices, such as solar cells.

Donner et al., Analytical Chemistry, Vol. 78, No. 8, 2816-2822 (2006) describe the preparation of carbon-based optically transparent electrodes by pyrolysis in a reducing atmosphere of thin films of photoresist AZ@ 4330-RS after it is spin coated onto quartz substrates. The photoresist AZ@ 4330-RS from Clariant is a cresol-novolak resin with highly branched structures and the reaction of this polymer with diazonaphthoquinono-sulfonic esters results in a hard amorphous carbon structure. The films obtained by this course of action show low transparency of only 47% for a 13 nm thick carbon film which might not meet requirements in applications such as optoelectronic devices.

Lee et al., Appl. Mater. Interfaces, 2009, 1 (4), pp 927-933, discloses spin coating and pyrolyzing thin layers of Durez Furfuryl alcohol resin no. 16470 (Occidental Chemical Corp.) Koppers Inc. coal tar pitch and Shipley S1805 photoresist (PR) into thin 3 to 6 nm carbon layers on glass substrates. Schreiber, Applied Surface Science, Volume 256, Issue 21, 15 Aug. 2010, Pages 6186-6190, discloses spin coating and pyrolyzing various photoresists, e.g. PMMA, SU8, AZ nLOF 2070, AZ nLOF 4533, ma-N 20401 from MicroChemicals GmbH, Ulm, Germany.

US 20100187482 A1 describes the production of a thin highly transparent and conducting carbon film by spin coating a solution of a discotic precursor and heating the substrate from 400° C. to 2,000° C. The carbon film obtained, according to the process of US 20100187482 A1, has a higher thermal and chemical stability than traditionally used ITO. Further, carbon film has an extremely smooth surface, which cannot be obtained for example with carbon nanotube films. US 20100187482 A1 describes films having both a high transparency and at the same time a low electrical resistance. Depending on the thickness of the carbon film of US 20100187482 A1, the resistivity of the carbon film of US 20100187482 A1 is between $10^{-5}$ $\Omega \cdot m$ and $10^{-8}$ $\Omega \cdot m$.

According to US 20100187482 A1:

" . . . a compromise between electrical resistance and optical transparency had to be accepted with all known methods due to their dependence on the carbon film thickness. Generally, resistance of carbon films undergoes a dramatic increase as thickness decreases below around 30 nm. Therefore, hitherto reported carbon films even in the thickness of .about. 13 nm, with sheet resistance in the range of 1000-2000 ohm/sq, have transmittance lower than 55%. Since these reported carbon film electrodes were only used in spectroelectrochemical studies, such transparency was enough. However, such low transparency cannot meet demand of modern devices such as optoelectronic devices. Besides high transparency, modern devices require transparent electrodes with low resistance, smooth surface as well as suitable work function which depends strongly on the structure of carbon film. Obviously, the type of precursor and preparing methods are important for fabrication of structure-controllable carbon films. Furthermore, most of the reported methods for preparing transparent carbon films are complicated."

A problem remains in the industry to develop a low viscosity formulation that can be cured and carbonized in a layered structure for example in a thin layer (e.g. 1 micron in thickness or less) with high light transmittance and high conductivity. Therefore, it would be an advance in the art to prepare a suitable precursor and a simple procedure for making a highly transparent, conductive and structure-controllable carbon film with a smooth surface and an appropriate work function for modern device applications, particularly for use in optoelectronic devices.

SUMMARY

The present invention solves some of the problems of the prior art by providing a conductive carbonized layered article. The present invention is directed to an inert, abundant and low-cost conductive carbonized layered article; and a process for manufacturing the conductive carbonized layered article.

One embodiment of the present invention includes a process for preparing a conductive carbonized layered article starting from a low viscosity curable liquid epoxy resin formulation. For example, one preferred embodiment of the process for preparing a conductive carbonized layered article includes the steps of:

(I) providing a liquid carbon precursor formulation comprising (a) at least one aromatic epoxy resin; and (b)(i) at least one aromatic co-reactive curing agent, (b)(ii) at least one catalytic curing agent, or (b)(iii) a mixture thereof; wherein the liquid precursor formulation has a neat viscosity of less than 10,000 mPa-s at 25° C. prior to adding optional components, prior to curing, and prior to carbonizing; and wherein the liquid precursor formulation being cured has a carbon yield of at least 35 weight percent disregarding the weight of the substrate and any optional components present in the composition;

(II) applying the liquid formulation of step (I) as a thin coating layer onto at least a portion of the surface of a substrate;

(III) curing the liquid formulation of step (II) to form a cured product; wherein the cured product has a carbon yield of at least 35 weight percent disregarding the weight of the substrate and any optional components present in the composition; and (IV) carbonizing the cured product of step (III) to form a conductive carbonized layered article.

Another embodiment of the present invention is directed to a conductive carbonized layered article prepared by the above process. The conductive carbonized layered article prepared by the above process comprises the combination of the carbonized layer and the substrate onto which the layer is applied.

In one preferred embodiment, the conductive carbonized layered article prepared by the above process includes a carbon optical transparent conductor such as a carbon optical transparent electrode (COTE).

DETAILED DESCRIPTION

"Optically transparent" herein means at least 20 percent light transmittance measured using visible light.

"Resistivity" herein means electrical resistivity as the ratio of the electric field to the current the electric field creates.

"Conductivity" herein means electrical conductivity as the inverse of the resistivity.

"Saturated calomel electrode" or "SCE" is a reference electrode based on the reaction between elemental mercury and mercury(I) chloride which is reversible, shows little hysteresis, follows Nernst equation, and keeps a stable potential with time. (See for instance Michael J. Sailor, Porous Silicon in *Practice: Preparation, Characterization and Applications*, First Edition, 2012, Wiley-VCH Verlag GmbH & Co. KGaA)

"Wetting" or "wetting ability" or "wettability" herein means affinity between a liquid and the surface of a substrate translating into the ability of the liquid to spread on the surface of the substrate.

In its broadest scope, a conductive carbonized layered article of the present invention may be manufactured by applying a curable formulation to at least a portion of the surface of a substrate, and then curing and carbonizing the curable formulation on the surface of the substrate to produce a conductive carbonized layered article having a thin layer (e.g., less than 0.1 micron) of carbonized material on at least a portion of the surface of the substrate. Accordingly, in carrying out the process of the present invention, the first step is to prepare or provide a curable low viscosity liquid carbon precursor composition or formulation.

For example, in one embodiment, the curable low viscosity liquid carbon precursor formulations, and processes for producing such formulations, useful in the present invention may include for example any of the formulations and processes described in co-pending U.S. Provisional Patent Application Ser. No. 61/660,417.

In another embodiment, examples of the curable low viscosity liquid carbon precursor formulation useful in the present invention may include the curable compositions or formulations described in co-pending U.S. Provisional Patent Application Ser. No. 61/660,397 and co-pending U.S. Provisional Patent Application Ser. No. 61/660,403.

"Carbonizing", "carbonization" or "pyrolyzing" herein means removing a significant portion of non-carbon elements from a composition by heating the composition at a temperature of 10° C./minute from 25° C. to 1,000° C. under an inert atmosphere such as nitrogen.

"Carbon yield" with reference to a cured composition herein means the percent weight remaining from a cured sample of a composition treated at 10° C./minute from 25° C. to 1,000° C. under an inert atmosphere such as nitrogen, disregarding the weight of the substrate and any optional components present in the composition.

For example, the curable low viscosity liquid carbon precursor formulation useful for preparing a conductive carbonized layered article includes (a) at least one aromatic epoxy resin; and (b)(i) at least one aromatic co-reactive curing agent, (b)(ii) at least one catalytic curing agent, or (b)(iii) a mixture thereof; wherein the liquid precursor composition has a neat viscosity of less than 10,000 mPa-s at 25° C. prior to adding optional components, prior to curing, and prior to carbonizing; and wherein the liquid precursor composition being cured has a carbon yield of at least 35 weight disregarding the weight of the substrate and any optional components present in the composition The aromatic epoxy resin compound, component (a), useful in the curable liquid carbon precursor formulation can be one aromatic epoxy resin compound or a combination of two or more epoxy resin compounds, wherein at least one of the epoxy resin compounds is an aromatic epoxy resin. For example, one preferred embodiment of the aromatic epoxy resin useful in the present invention may be a divinylarene dioxide.

In one embodiment, the divinylarene dioxide useful in the curable liquid carbon precursor composition of the present invention may include any of the divinylarene dioxides described in U.S. patent application Ser. No. 13/133,510.

In another embodiment, the divinylarene dioxide useful in preparing the curable liquid carbon precursor composition of the present invention may include, for example, any substituted or unsubstituted arene nucleus bearing one or more vinyl groups in any ring position. For example, the arene portion of the divinylarene dioxide may consist of benzene, substituted benzenes, (substituted) ring-annulated benzenes or homologously bonded (substituted) benzenes, or mixtures thereof. The divinylbenzene portion of the divinylarene dioxide may be ortho, meta, or para isomers or any mixture thereof. Additional substituents may consist of $H_2O_2$-resistant groups including saturated alkyl, aryl, halogen, nitro, isocyanate, or RO— (where R may be a saturated alkyl or aryl). Ring-annulated benzenes may consist of naphthalene, tetrahydronaphthalene, and the like. Homologously bonded (substituted) benzenes may consist of biphenyl, diphenylether, and the like.

The divinylarene dioxide used for preparing the formulations of the present invention may be illustrated generally by chemical Structures I-IV as follows:

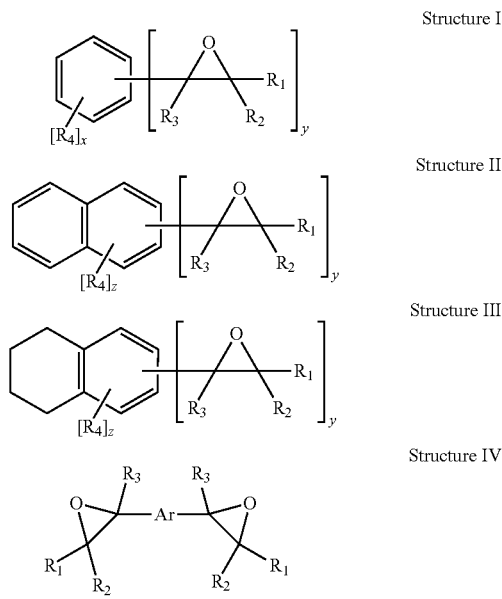

In the above Structures I, II, III, and IV of the divinylarene dioxide useful in the present invention, each $R_1$, $R_2$, $R_3$ and $R_4$ individually may be hydrogen, an alkyl, cycloalkyl, an aryl or an aralkyl group; or a $H_2O_2$-resistant group including for example a halogen, a nitro, an isocyanate, or an RO group, wherein R may be an alkyl, aryl or aralkyl; x may be an integer of 0 to 4; y may be an integer greater than or equal to 2; x+y may be an integer less than or equal to 6; z may be an integer of 0 to 6; and z+y may be an integer less than or equal to 8; and Ar is an arene fragment including for example, 1,3-phenylene group. In addition, R4 can be a reactive group(s) including epoxide, isocyanate, or any reactive group and Z can be an integer from 0 to 6 depending on the substitution pattern.

In one embodiment, the divinylarene dioxide useful in the present invention may be produced, for example, by the process described in U.S. Patent Provisional Application Ser. No. 61/141,457, filed Dec. 30, 2008, by Marks et al. In another embodiment, the divinylarene dioxides useful in the present invention are disclosed in, for example, U.S. Pat. No. 2,924,580.

In still another embodiment, the divinylarene dioxide useful in the present invention may include, for example, divinylbenzene dioxide (DVBDO), divinylnaphthalene dioxide, divinylbiphenyl dioxide, divinyldiphenylether dioxide, or mixtures thereof.

In one preferred embodiment of the present invention, the divinylarene dioxide used in the curable liquid carbon precursor composition of the present invention can be for example DVBDO. Divinylarene dioxides such as for example DVBDO are a class of diepoxides which have a relatively low liquid viscosity but a higher rigidity and crosslink density than conventional epoxy resins.

In another preferred embodiment, the divinylarene dioxide compound useful in the present invention includes, for example, a DVBDO as illustrated by the following chemical formula of Structure V:

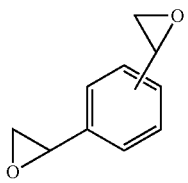

Structure V

The chemical formula of the above DVBDO compound may be as follows: $C_{10}H_{10}O_2$; the molecular weight of the DVBDO is 162.2; and the elemental analysis of the DVBDO is: C, 74.06; H, 6.21; and O, 19.73 with an epoxide equivalent weight of 81 g/mol.

Structure VI below illustrates another embodiment of a preferred chemical structure of the DVBDO useful in the present invention:

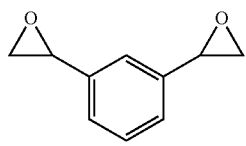

Structure VI

Structure VII below illustrates still another embodiment of a preferred chemical structure of the DVBDO useful in the present invention:

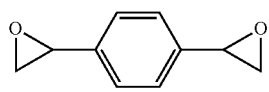

Structure VII

When DVBDO is prepared by the processes known in the art, it is possible to obtain one of three possible isomers: ortho, meta, and para. Accordingly, the present invention includes a DVBDO illustrated by any one of the above Structures individually or as a mixture thereof. Structures VI and VII above show the meta (1,3-DVBDO) isomer and the para (1,4-DVBDO) isomer of DVBDO, respectively. The ortho isomer is rare; and usually DVBDO is mostly produced generally in a range of from 9:1 to 1:9 ratio of meta (Structure VI) to para (Structure VII) isomers. The present invention preferably includes as one embodiment a range of from 6:1 to 1:6 ratio of Structure VI to Structure VII, and in other embodiments the ratio of Structure VI to Structure VII may be from 4:1 to 1:4 or from 2:1 to 1:2.

In yet another embodiment of the present invention, the divinylarene dioxide may contain quantities (such as for example less than 20 wt %) of substituted arenes and/or arene oxides. The amount and structure of the substituted arenes and/or arene oxides mixed with a divinylarene dioxide composition depends on the process used in the preparation of the divinylarene precursor which is, in turn, used to prepare the divinylarene dioxide. For example, the divinylarene precursor such as divinylbenzene (DVB) can be prepared by the dehydrogenation of diethylbenzene (DEB), and the resultant product composition may contain quantities of ethylvinylbenzene (EVB) and DEB. During the dehydrogenation reaction of DEB, wherein an oxidant such as hydrogen peroxide, the EVB present in the reaction mixture can react with hydrogen peroxide to produce ethylvinylbenzene oxide while DEB remains unchanged. The presence of ethylvinylbenzene oxide and DEB in the divinylarene dioxide can increase the epoxide equivalent weight of the divinylarene dioxide to a value greater than that of a pure divinylarene dioxide compound.

In one embodiment, the divinylarene dioxide, (for example DVBDO) useful in the present invention comprises a low viscosity liquid epoxy resin. For example, the viscosity of the divinylarene dioxide used in the present invention ranges generally from 0.001 Pa-s to 0.1 Pa-s in one embodiment, from 0.01 Pa-s to 0.05 Pa-s in another embodiment, and from 0.01 Pa-s to 0.025 Pa-s in still another embodiment, at 25° C.

One advantageous property of the divinylarene dioxide useful in the present invention is its rigidity. The rigidity property of the divinylarene dioxide is measured by a calculated number of rotational degrees of freedom of the dioxide excluding side chains using the method of Bicerano described in *Prediction of Polymer Properties*, Dekker, New York, 1993. The rigidity of the divinylarene dioxide used in the present invention may range generally from 6 to 10 rotational degrees of freedom in one embodiment, from 6 to 9 rotational degrees of freedom in another embodiment, and from 6 to 8 rotational degrees of freedom in still another embodiment.

The aromatic epoxy resin useful in the present invention curable liquid carbon precursor composition may include a wide variety of aromatic epoxy resins known in the art other than the divinylarene dioxide. The aromatic epoxy resin may be may be substituted or unsubstituted. The aromatic epoxy resin may be monomeric or polymeric. The aromatic epoxy resin may include a single aromatic epoxy resin or may include a combination of two or more aromatic epoxy resins.

For example, the aromatic epoxy resin useful in the present invention may include, one or more aromatic epoxy resin compounds described in Pham, H. Q. and Marks, M. J., *Epoxy Resins*, the Kirk-Othmer Encyclopedia of Chemical Technology; John Wiley & Sons, Inc.: online Dec. 4, 2004 and in the references therein; in Lee, H. and Neville, K., *Handbook of Epoxy Resins*, McGraw-Hill Book Company, New York, 1967, Chapter 2, pages 2-1 to 2-33, and in the references therein; May, C. A. Ed., *Epoxy Resins: Chemistry and Technology*, Marcel Dekker Inc.: New York, 1988 and in the references therein; and in U.S. Pat. No. 3,117,099.

Some of the aromatic epoxy resin compounds useful in the present invention include for example epoxy compounds based on reaction products of polyfunctional phenols, aromatic amines, or aminophenols with epichlorohydrin. A few non-limiting embodiments include, for example, bisphenol A diglycidyl ether, bisphenol F diglycidyl ether, resorcinol diglycidyl ether, and triglycidyl ethers of p-aminophenols. Other suitable epoxy compounds known in the art include for example reaction products of epichlorohydrin with o-cresol novolacs, hydrocarbon novolacs, and, phenol novolacs. The epoxy compound may also be selected from commercially available products such as for example, D.E.R. 331®, D.E.R.332, D.E.R. 354, D.E.R. 580, D.E.N. 425, D.E.N. 431, or D.E.N. 438 epoxy resins available from The Dow Chemical Company.

As aforementioned, the curable liquid carbon precursor composition can be prepared by admixing (a) the at least one aromatic epoxy resin described above with (b)(i) at least one aromatic co-reactive curing agent, or (b)(ii) at least one catalytic curing agent, or (b)(iii) a mixture of the at least one aromatic co-reactive curing agent and the at least one catalytic curing agent.

An "aromatic co-reactive curing agent" herein means an aromatic compound bearing functional groups which react with the epoxide of the aromatic epoxy resin to effect curing by condensation of the epoxide groups of the aromatic epoxy resin with the functional groups of the aromatic co-reactive curing agent.

A "catalytic curing agent" herein means a compound which reacts with the epoxide group of the aromatic epoxy resin to initiate curing of the aromatic epoxy resin by epoxide homopolymerization.

The at least one aromatic co-reactive curing agent or the at least one catalytic curing agent of the carbon precursor composition of the present invention can include for example one or a combination of two or more of the above curing agents. The aromatic co-reactive curing agent and the catalytic curing agent of the carbon precursor composition useful in the present invention may be selected from any aromatic co-reactive curing agents or any catalytic curing agents for epoxy resins known in the art.

For example, the aromatic co-reactive curing agent (also referred to as a hardener or cross-linking agent) useful in the present invention may be any aromatic compound having an active group being reactive with the reactive epoxy group of the epoxy resin. The chemistry of such curing agents is described in the previously referenced books on epoxy resins. The aromatic co-reactive curing agent useful in the present invention includes nitrogen-containing compounds such as amines and their derivatives; oxygen-containing compounds such as carboxylic acid terminated polyesters, anhydrides, phenol-formaldehyde resins, amino-formaldehyde resins, phenol, bisphenol A and cresol novolacs, and phenolic-terminated epoxy resins.

In one preferred embodiment, diaminodiphenylsulfone and their isomers, aminobenzoates, various acid anhydrides, phenol-novolac resins and cresol-novolac resins, for example, may be used in the present invention, but the present invention is not restricted to the use of these compounds.

The aromatic co-reactive curing agent of choice may depend on the aromatic epoxy resin used in the formulation. Generally, the aromatic co-reactive curing agent useful in the present invention may be selected from, for example, but are not limited to, phenols, benzoxazines, aromatic anhydrides, aromatic amines, aromatic carbodiimides, aromatic polyesters, aromatic polyisocyanates, and mixtures thereof. In the cases of a divinylarene dioxide used as the aromatic epoxy resin the aromatic co-reactive curing agent can also include a phenol, diphenol, or polyphenol.

In one embodiment, the at least one aromatic co-reactive curing agent may include one or more of aromatic amines such as methylenedianiline (MDA), toluenediamine (TDA), diethyltoluenediamine (DETDA), diaminodiphenylsulfone (DADS), polyphenols such as bisphenol A, bisphenol F, 1,1-bis(4-hydroxyphenyl)-ethane, hydroquinone, resorcinol, catechol, tetrabromobisphenol A, novolacs such as phenol novolac, bisphenol A novolac, hydroquinone novolac, resorcinol novolac, naphthol novolac, anhydrides such as phthalic anhydride, trimellitic anhydride, or mixtures thereof.

In a preferred embodiment, the aromatic co-reactive curing agent blended with the at least one aromatic epoxy resin such as for example a divinylarene dioxide in preparing the curable carbonized composition liquid precursor of the present invention may comprise, for example, any compound adapted for providing a carbon yield of greater than 40 percent when the compound is subjected to carbonization or pyrolysis. In one embodiment, the aromatic co-reactive curing agent adapted for providing a high carbon yield may include for example a phenol such as p-cresol or m-cresol or other phenol, and mixtures thereof. One preferred embodiment includes a phenol compound useful for the curable composition of the present invention, such as for example p-cresol.

Generally, the ratio r of epoxide equivalents from the aromatic epoxy resin to the co-reactive groups of the aromatic co-reactive curing agent adapted for providing a high carbon yield used in the present invention, may be for example, from 0.1 to 10 in one embodiment, from 0.2 to 8 in another embodiment; from 0.4 to 6 in still another embodiment; and from 1 to 5 in yet another embodiment. When r is greater than 1.0, after curing the excess epoxide may remain unreacted or may be reacted into the thermoset network. When the aromatic epoxy resin is a divinylarene dioxide and the aromatic co-reactive curing agent is a phenol, r is defined as explained in co-pending U.S. Provisional Patent Application No. 61/660,397.

The catalytic curing agent useful in the present invention may include, for example, Bronsted acids, Lewis acids, Lewis bases, alkali bases, Lewis acid-Lewis base complexes, quaternary ammonium compounds, quaternary phosphonium compounds, or mixtures thereof. Suitable examples of Bronsted acids include sulfuric acid, sulfonic acids, perchloric acid, phosphoric acid, partial esters of phosphoric acid, and mixtures thereof. One suitable example of a Lewis acid includes boron trifluoride. Suitable examples of Lewis bases include tertiary amines, imidazoles, amidines, substituted ureas and mixtures thereof. One suitable example of an alkali base includes potassium hydroxide. One suitable example of a Lewis acid-Lewis base complex includes boron trifluoride-ethylamine complex. One suitable example of a quaternary ammonium compound is benzyltrimethylammonium hydroxide. One suitable example of a quaternary phosphonium compound is tetrabutylphosphonium hydroxide.

In addition, when an aromatic epoxy resin such as a divinylarene dioxide is used, the catalytic curing agent useful in the present invention can include the latent catalysts described in co-pending U.S. Provisional Patent Application Ser. No. 61/660,403.

In preparing the curable liquid carbon precursor composition of the present invention, optional compounds can be added to the curable liquid carbon precursor composition including for example at least one curing catalyst. A "curing catalyst" or "cure catalyst" herein means a compound used to facilitate the reaction of the at least one aromatic epoxy resin with the aromatic co-reactive curing agent compound. The curing catalyst may be selected based on the epoxy resin employed and the aromatic co-reactive curing agent employed in the present invention composition.

In one illustrative embodiment when the epoxy resin is for example a divinylarene dioxide and the curing agent is for example a phenol, the optional curing catalyst useful in the present invention may include at least one acid compound-related cure catalyst to facilitate the reaction of the divinylarene dioxide compound with the phenol. In one embodiment, the catalyst useful in the present invention may include, for example, any one or more of the catalysts described in U.S. Provisional Patent Application Ser. No. 61/556,979, such as for example Bronsted acids (e.g., CYCAT® 600 commercially available from Cytec), Lewis acids, and mixtures thereof. In another embodiment, the catalysts may include for example a latent alkylating ester such as for example, any one or more of the catalysts described in WO 9518168.

In another embodiment, the latent alkylating ester cure catalyst may include for example the esters of sulfonic acids such as methyl p toluenesulfonate (MPTS), ethyl p-toluenesulfonate (EPTS), and methyl methanesulfonate (MMS); esters of α-halogenated carboxylic acids such as methyl trichloroacetate and methyl trifluoroacetate; and esters of phosphonic acids such as tetraethylmethylene-diphosphonate; or any combination thereof. One preferred embodiment of the cure catalyst used in the present invention may include for example MPTS. Other curing catalysts useful in the present invention may include for example those described in co-pending U.S. Provisional Patent Application Ser. No. 61/660,397.

Generally, the amount of catalytic curing agent or optional cure catalyst used in the present invention, may be for example, from 0.01 wt % to 20 wt % in one embodiment, from 0.1 wt % to 10 wt % in another embodiment; from 0.1 wt % to 5 wt % in still another embodiment; and from 0.1 wt % to 3 wt % catalyst in yet another embodiment. The use of lower levels of catalytic curing agent or optional cure catalyst would reduce reactivity and would result in less crosslinked network; and the use of higher levels of catalytic curing agent or optional cure catalyst would be uneconomical.

The curable formulation of the present invention may include as an optional compound at least one other second epoxy compound different from the above-described first aromatic epoxy resin such as DVBDO. For example, the second epoxy compound may include one epoxy compound or may include a combination of two or more epoxy compounds. The epoxy compounds useful in the present invention are those compounds may include a wide variety of epoxy compounds known in the art. For example, the epoxy compound may be saturated or unsaturated, aliphatic, cycloaliphatic, aromatic or heterocyclic and may be substituted. The epoxy compound may be monomeric or polymeric.

For example, the formulation of the present invention may include, one or more epoxy compounds known in the art such as epoxy compounds described in Pham, H. Q. and Marks, M. J., *Epoxy Resins*, the Kirk-Othmer Encyclopedia of Chemical Technology; John Wiley & Sons, Inc.: online Dec. 4, 2004; in Lee, H. and Neville, K., *Handbook of Epoxy Resins*, McGraw-Hill Book Company, New York, 1967, Chapter 2, pages 2-1 to 2-33, and in the references therein; May, C. A. Ed., *Epoxy Resins: Chemistry and Technology*, Marcel Dekker Inc.: New York, 1988; and in U.S. Pat. No. 3,117,099.

Some of the epoxy compounds useful as the second epoxy resin may include for example epoxy compounds based on reaction products of polyfunctional alcohols, phenols, cycloaliphatic carboxylic acids, aromatic amines, or aminophenols with epichlorohydrin. A few non-limiting embodiments include, for example, bisphenol A diglycidyl ether, bisphenol F diglycidyl ether, resorcinol diglycidyl ether, and triglycidyl ethers of para-aminophenols. Other suitable epoxy compounds known in the art include for example reaction products of epichlorohydrin with o-cresol novolacs, hydrocarbon novolacs, and, phenol novolacs. The epoxy compound may also be selected from commercially available products such as for example, D.E.R. 331®, D.E.R.332, D.E.R. 354, D.E.R. 580, D.E.N. 425, D.E.N. 431, D.E.N. 438, D.E.R. 736, or D.E.R. 732 epoxy resins available from The Dow Chemical Company.

When a single aromatic epoxy resin is used herein, or when an aromatic epoxy resin is used in combination or blend with one or more other non-aromatic, aliphatic, or cycloaliphatic epoxy compounds, the total amount of the epoxy resin used in the formulation useful in the present invention may range generally from 0.5 weight percent (wt %) to 100 wt % in one embodiment, from 1 wt % to 99 wt % in another embodiment, from 2 wt % to 98 wt % in still another embodiment, and from 5 wt % to 95 wt % in yet another embodiment, depending on the fractions of the other ingredients in the reaction product composition.

Other optional compounds that may be added to the curable liquid carbon precursor composition of the present invention may include compounds that are normally used in curable resin formulations known to those skilled in the art. For example, the optional components may comprise compounds that can be added to the composition to enhance application properties (e.g. surface tension modifiers or flow aids), reliability properties (e.g. adhesion promoters) the reaction rate, the selectivity of the reaction, and/or the catalyst lifetime.

Other optional compounds that may be added to the curable liquid carbon precursor composition may include, for example, a solvent to lower the viscosity of the formulation even further from the initial viscosity of the composition; other epoxy resins different from the aromatic epoxy resin (e.g., aliphatic glycidyl ethers or cycloaliphatic epoxy resins); other curing agents different from aromatic co-reactive curing agents and catalytic curing agents; fillers; pigments; toughening agents; flow modifiers; adhesion promoters; diluents; stabilizers; plasticizers; curing catalysts; catalyst de-activators; flame retardants; coal tar pitch; petroleum pitch; aromatic hydrocarbon resins; carbon nanotubes; graphene; carbon black; carbon fibers; or mixtures thereof.

Generally, the amount of the other optional compounds, when used in the present invention, may be for example, from 0 wt % to 90 wt % in one embodiment, from 0.01 wt % to 80 wt % in another embodiment; from 0.1 wt % to 65 wt % in still another embodiment; and from 0.5 wt % to 50 wt % curing agent in yet another embodiment.

One embodiment for preparing the above-described curable high carbon yield low neat viscosity liquid carbon precursor formulation or composition includes, for example the step of admixing (a) at least one aromatic epoxy resin; and (b)(i) at least one aromatic co-reactive curing agent, (b)(ii) at least one catalytic curing agent, or (b)(iii) a mixture thereof; wherein the liquid precursor composition has a neat viscosity of less than 10,000 mPa-s at 25° C. prior to adding optional components, prior to curing, and prior to carbonizing; and wherein the liquid precursor composition being cured has a carbon yield of at least 35 weight percent disregarding the weight of the substrate and any optional components present in the composition; and (c) optionally, at least one cure catalyst or other optional ingredients as desired.

The compounds used in making the curable liquid carbon precursor composition are beneficially low viscosity materials that mix without special effort. For example, the preparation of the curable liquid carbon precursor composition of the present invention is easily achieved by blending the ingredients of the composition with a magnetic stir bar mixer or a pail mixer. For example, the curable liquid carbon precursor composition can be mixed with a standard pail mixer at from 1 rpm to 200 rpm.

The required and optional components or ingredients of the curable liquid carbon precursor composition or formulation of the present invention are typically mixed and dispersed at a temperature enabling the preparation of an effective curable composition having the desired balance of properties for a particular application. For example, the temperature during the mixing of the components may be generally from −10° C. to 100° C. in one embodiment, and from 0° C. to 50° C. in another embodiment. Lower mixing temperatures help to minimize reaction of the resin and hardener components to maximize the pot life of the formulation.

As one illustrative embodiment and not be limited thereby, a divinylbenzene dioxide, a p-cresol, a cure catalyst, and other desirable and optional additives, for example an additional epoxy resin, can be admixed together to form the curable liquid carbon precursor composition of the present invention.

The preparation of the curable liquid carbon precursor composition of the present invention, and/or any of the steps thereof, may be a batch or a continuous process. The mixing equipment used in the process may be any vessel and ancillary equipment well known to those skilled in the art.

The curable liquid carbon precursor composition useful in the present invention, prior to adding any optional compounds, prior to curing, and prior to carbonizing, has a neat viscosity of less than 10,000 mPa-s at 25° C. For example, the curable liquid carbon precursor composition without optional compounds and prior to curing and carbonizing has a neat viscosity of generally less than 10,000 mPa-s in one embodiment, from 1 mPa-s to 5,000 mPa-s in another embodiment, from 5 mPa-s to 3,000 mPa-s in still another embodiment, and from 10 mPa-s to 1,000 mPa-s in yet another embodiment, at 25° C. In other embodiments, the neat viscosity of the curable liquid carbon precursor composition prior to curing can include 1 mPa-s or greater, 5 mPa-s or greater, or 10 mPa-s or greater. In other embodiments, the neat viscosity of the curable liquid carbon precursor composition prior to curing can include 10,000 mPa-s or lower, 5,000 mPa-s or lower, 3,000 mPa-s or lower or 1,000 mPa-s or lower.

The above low viscosity formulation (lower than 10,000 mPa-s) can advantageously be used without having to dilute the formulation with a solvent to obtain the low viscosity.

The first step of producing a conductive carbonized layered article of the present invention is providing a curable formulation of the present invention as described above. Upon preparing the above curable formulation as described above, the formulation can be further processed to form a conductive carbonized layered article.

The process of producing a conductive carbonized layered article of the present invention includes the step of applying the above described curable aromatic epoxy resin liquid formulation to at least a portion of the surface of a substrate carbon. For example, the substrate adapted to be coated with the curable aromatic epoxy resin liquid formulation may include for example graphite, glass, ceramic, metals, quartz, and the like; and combinations thereof.

The application step of the present process can include for example coating such as rolling, spraying, brushing, and pouring; or combinations thereof.

The process of the present invention includes curing the aforementioned curable liquid carbon precursor composition to form a cured material or cured product. The curing of the curable liquid carbon precursor composition may be carried out at a predetermined temperature and for a predetermined period of time sufficient to cure the liquid carbon precursor composition. For example, the temperature of curing the curable liquid carbon precursor composition or formulation may be generally from 10° C. to 350° C. in one embodiment; from 25° C. to 200° C. in another embodiment, from 100° C. to 190° C. in still another embodiment; and from 125° C. to 175° C. in yet another embodiment. In other embodiments, the temperature of curing can include 10° C. or greater, 25° C. or greater, 100° C. or greater, or 125° C. or greater. In other embodiments, the temperature of curing can include 350° C. or lower, 200° C. or lower, 190° C. or lower, or 175° C. or lower.

Generally, the curing time for curing the curable liquid carbon precursor composition or formulation may be chosen between 1 minute to 90 days in one embodiment, 2 minutes to 7 days, 3 minutes to 1 day, 5 minutes to 8 hours, to between 7 minutes to 4 hours in another embodiment, and between 10 minutes to 2 hours in still another embodiment. In other embodiments, the time of curing can include 1 minute or greater, 2 minutes or greater, 3 minutes or greater, 5 minutes or greater, 7 minutes or greater, or 10 minutes or greater. In other embodiments, the time of curing can include 90 days or lower, 7 days or lower 1 day or lower, 8 hours or lower, 4 hours or lower, or 2 hours or lower.

The divinylarene dioxide of the present invention such as DVBDO, which is one embodiment of the epoxy resin component of the curable composition of the present invention, may be used as the sole resin to form the epoxy matrix in the final curable liquid carbon precursor composition or formulation; or the divinylarene dioxide resin may be used in combination with another epoxy resin that is different from the divinylarene dioxide as the epoxy component in the final curable liquid carbon precursor composition or formulation.

Upon curing the curable liquid carbon precursor composition having a neat viscosity of less than 10,000 mPa-s at 25° C., the resultant cured composition is adapted for being carbonized or further processed. Upon curing the curable liquid carbon precursor composition, the cured composition comprises a solid body which can optionally be formed or shaped into a desired preform structure before carbonizing the structure.

One of the beneficial consequences of producing the cured material from curing the curable liquid carbon precursor composition described above includes producing a cured product having a carbon yield of generally at least 35 wt % disregarding the weight of the substrate and any optional components present in the composition. For example, the carbon yield of the cured product, as measured by thermogravimetric analysis (TGA), generally may be from 35 wt % to 95 wt % in one embodiment, from 40 wt % to 90 wt % in another embodiment, from 45 wt % to 85 wt % in still another embodiment, or from 50 wt % to 80 wt % in yet another embodiment, based on the total weight of the cured composition. In other embodiments, the carbon yield of the cured product can include 35 wt % or greater, 40 wt % or greater, 45 wt % or greater, or 50 wt % or greater. In other embodiments, the carbon yield of the cured product can include 95 wt % or lower, 90 wt % or lower, 85 wt % or lower, or 80 wt % or lower.

The resulting cured material (i.e., the cross-linked product) produced from curing the curable liquid carbon precursor composition described above forms a cured conductive carbonized layered article precursor that can be carbonized in accordance with the present invention to further form a carbonized composition or carbonized product with several improved properties over conventional epoxy resins which have been cured and carbonized.

In one embodiment, the curing step described above can be carried out concurrently with the carbonizing step in whole or in part. In another embodiment, the carbonizing step can be carried out as a separate step from the curing step.

For example, the process of the present invention can include the step of carbonizing the cured material in an inert atmosphere such as nitrogen or vacuum at a predetermined temperature and for a predetermined period of time sufficient to carbonize the cured material and provide a carbonized composition having a carbon yield of greater than 40 wt %. For example, the temperature of carbonizing the cured material may be generally from 350° C. to 4,000° C. in one embodiment; from 400° C. to 3,500° C. in another embodiment; from 500° C. to 3,000° C. in still another embodiment; and from 800° C. to 2000° C. in yet another embodiment.

Generally, the time of carbonizing the cured material may depend on the amount of carbon material, the size of the carbon article, and the complexity of the carbon article. In one illustrative embodiment, the time of carbonizing the cured material can be chosen for example in the range from 1 minute to 90 days in one embodiment, from 30 minutes to 7 days in another embodiment, and from 1 hour to 24 hours in still another embodiment.

Carbonizing the cured material as described herein above provides a carbonized composition or carbonized product having several advantages over the prior art. For example, one advantage of the carbonized composition of the present invention is that the carbonized composition has a low amount of impurities. The impurities can include for example metals and non-metals. The presence of impurities in the carbonized composition may introduce deleterious effects in the properties of the resulting carbonized material in its various applications and therefore the impurities in the carbonized product should be avoided.

After applying the curable liquid formulation of the present invention to a substrate; then curing the formulation; and then carbonizing the cured material; any number of optional heat treatments; and/or further fabrication methods may be employed to form the conductive carbonized layered article of the present invention.

Several advantageous properties are exhibited by the conductive carbonized layered article including for example, surface resistivity, transmittance, and thickness. For example, generally, the surface resistivity of the conductive carbonized layered article can be less than $10^{-2}$ Ω·cm as measured by ASTM D-257-93 in one embodiment; and from $10^{-9}$ Ω·cm to $10^{-2}$ Ω·cm in another embodiment. The transmittance of the conductive carbonized layered article can be for example greater than 20% as measured by ASTM D1003 in one embodiment; and from 20% to 100% in another embodiment. In one embodiment, the thickness of the conductive carbonized layered article can be for example less than 10 meters; and in another embodiment, the thickness of the conductive carbonized layered article can be for example from 1 nanometer to 10 meters.

The properties above can vary depending on the application in which the conductive carbonized layered article is used. The carbonized layered article of the present invention for example can include a carbon/graphite material with a thin coating layer; and such coated substrate may be used to manufacture various carbon articles such as for example a carbon optical transparent electrode (herein referred to by the acronym "COTE"), a semiconductor, a cathode, and the like.

As an illustrative example of the present invention, the structure of the COTE can include (a) a supporting substrate, and (b) a thin layer coating applied to at least a portion of the surface of the supporting substrate. The substrate can be for example, metal, quartz, ceramic, glass, or the like; and combinations thereof. In addition, the COTE can be in the form of a coating, a laminate, a multilayer member, a solid thick material of any shape, a rod, a sheet, a tube, and the like.

Other applications in which the conductive carbonized layered article can be used can include for example electronic display devices.

Still other applications of the present invention can include graphite electrodes for electrochemical production of alkali metals, in both analytical and industrial electrochemistry such as energy storage in batteries, supercapacitors, catalyst supports based interactions between carbon and electrolytes and redox systems as well as sensing, electrocatalysis, and electronics applications.

EXAMPLES

The following examples further illustrate the present invention in detail but are not to be construed to limit the scope thereof.

Various terms and designations used in the following examples are explained herein as follows:

"DVBDO" stands for divinylbenzene dioxide.
"MPTS" stands for methyl p-toluenesulfonate.
"TGA" stands for thermogravimetric analysis.
AZ nLOF 2070 is a photoresist commercially available from Clariant.

The following standard analytical equipments and methods are used in the Examples:

Measurement of Density

The higher the quality of the carbon, the higher the density of the carbon. With a higher density, the properties of the resultant carbonized product composite are improved such as increased durability at a higher temperature, increased thermal and electrical conductivity, and increased structural strength. Generally, the density of the a conductive carbonized layered article may be from 0.01 g/cm$^3$ to 3 g/cm$^3$. The density of a carbonized product can be characterized using a pycnometer.

Measurement of Resistivity

Resistivity by surface resistivity is measured by following guidelines from ASTM D-257-93 with lower voltage. Surface resistivity is measured using a surface resistance meter model 880, from Euro-Tech, Inc.

Measurement of Transmittance

Transmittance is measured following guidelines of ASTM D1003. Transmittance is measure on a Haze-gard plus from BYK-Gardner.

Measurement of Thickness

Thickness is measured by ellipsometry following guidelines of ASTM F576-00. Thickness is measured on a M-2000D Woollam Ellipsometer.

Measurement of Viscosity

The viscosity of the formulation is measured on a torsional rheometer TA Instruments AR2000 equipped with a 50 mm diameter smooth stainless steel upper plate and a bottom Peltier plate assembly controlling both the temperature of the liquid sample and the normal force acting on the surface of the Peltier plate. About 2 mL of the formulation is deposited on the bottom plate before the top plate is lowered onto the liquid formulation until a gap of 300 microns between the two plates is achieved. The top plate is then rotated at a nominal rate of 0.001 rad/s while the temperature of the bottom plate is raised from 25° C. to 65° C. at a rate of 10° C./minute. Viscosity is automatically calculated by the TA software and reported a function of the temperature.

Measurement of Carbon Yield

Carbon yield (% C) of the cured formulation is determined by thermogravimetric analysis under nitrogen using a TA Instruments Q5000 Thermogravimetric Analyzer with a temperature ramp of 10° C./minute from 25° C. to 1,000° C. The "% C" is defined as the wt % residue at the completion of the above analysis disregarding the weight of the substrate and any optional components present in the composition Example 1

In this Example 1, a COTE is produced by first preparing a curable formulation as follows:

A solution of liquid carbon precursor containing DVBDO/p-cresol/MPTS is prepared by adding at ambient temperature the three ingredients of the formulation using the weight ratio 87/12/1. The liquid formulation is rolled mixed for 15 minutes. The formulation is then diluted in a good solvent such as tetrahydrofuran, acetone or a mixture of thereof. The concentration of the liquid carbon formulation in the solvent formulation is 1 to 50% to obtain different thicknesses.

The viscosity of the formulation is 12 mPa-s.

Quartz substrates (typically 7 cm×7 cm) are cleaned with acetone and isopropanol and afterwards dried with Nitrogen and oxygen plasma treated using a Harrick Plasma Cleaner PDC-001.

The solution is filtered through a 0.2 µm filter and spin-coated onto the quartz slide substrates at angular speeds between 1000 rpm and 6000 rpm for 45 seconds.

The coated glass slides are baked at 150° C. for 60 seconds, then specimen are annealed in a vacuum tube furnace in nitrogen inert atmosphere. The carbon yield of the cured composition is >62 wt %.

Under same atmosphere conditions, the temperature is increased at the rate of 5° C./minute up to 1000° C. and held for 60 minutes, and then cooled to room temperature (about 25° C.).

Thickness is measured on a M-2000D Woollam Ellipsometer, surface resistivity is measured using a surface resistance meter model 880, from Euro-Tech, Inc., and transmittance is measure on a Haze-gard plus from BYK-Gardner.

Example 2

In this Example 2, a COTE is produced by first preparing a curable formulation as follows: A solution of liquid carbon precursor containing the following three ingredients: DVBDO/p-cresol/MPTS is prepared by mixing at ambient temperature the three ingredients of the formulation using the weight ratio 87/12/1, respectively. The liquid formulation is rolled mixed for 15 minutes.

Quartz substrates (glass slides) (typically 7 cm×7 cm) are cleaned with acetone and isopropanol and afterwards dried with Nitrogen and oxygen plasma treated using a Harrick Plasma Cleaner PDC-001.

The solution is filtered through a 0.2 um filter and heated until it reached 55° C. to lower its viscosity and spin-coated on 60° C. pre-heated glass slides at angular speeds between 1,000 rpm and 6,000 rpm for 45 seconds (s).

The coated glass slides are baked at 150° C. for 60 s. Then the baked specimens are annealed in a vacuum tube furnace in a nitrogen inert atmosphere. Under the same atmosphere conditions, the temperature is increased at the rate of 5° C./minute up to 1,000° C. and held for 60 minutes. Then the specimens are cooled to room temperature.

The thickness of the coating layer is measured on a M-2000D Woollam Ellipsometer. The surface resistivity of the coating layer is measured using a surface resistance meter model 880, from Euro-Tech, Inc. The transmittance of the coating layer is measured on a Haze-gard plus from BYK-Gardner.

Comparative Example A

A negative photoresist, AZ nLOF 2070, consisting of 1-methoxy-2-propanol acetate at 65 wt %, cresol novolak resin at 28 wt %, modified melamine\-formaldehyde resin at 5 wt %, phenolic polyol at 2 wt %, and benzeneacetonitrile derivative at 2 wt % is used in this example.

Quartz substrates (typically 7 cm×7 cm) are cleaned with acetone and isopropanol and afterwards dried with nitrogen and oxygen plasma treated using a Harrick Plasma Cleaner PDC-001.

The photoresist is diluted in a mixture of 1-methoxy-2-propanol and 1-methoxy-2-propanol acetate with a ratio of 70/30 down to concentration of photoresist to 20%. The solution is filtered through a 0.2 µm filter and spin-coated onto the quartz slide substrates at angular speeds between 1,000 rpm and 6,000 rpm for 45 seconds.

The coated glass slides are baked at 100° C. for 60 seconds, then the specimens are annealed in a vacuum tube furnace in forming atmosphere (% N2, 10% H2). p Under same atmosphere conditions, the temperature is increased at the rate of 3° C./minute to 1,000° C. and held there for 60 minutes, and then cooled to room temperature.

The invention claimed is:

1. A process for preparing a carbonized layered article comprising the steps of: (I) providing a liquid precursor composition, comprising (a) at least one aromatic epoxy resin; and (b)(i) at least one aromatic co-reactive curing agent, (b)(ii) at least one catalytic curing agent, or (b)(iii) a mixture thereof; wherein the liquid precursor composition has a neat viscosity of less than 10,000 mPa-s at 25° C. prior to adding optional components, prior to curing and prior to carbonizing; which optional components are selected from the group consisting of an additional epoxy resin different from the aromatic epoxy resin, an additional curing agent different from the aromatic co-reactive curing agent and the catalytic curing agent, a divinylarene dioxide, a filler, a reactive diluent, a flexibilizing agent, a processing aid, a toughening agent, and mixtures thereof;
   (II) applying the liquid precursor composition of step (I) as a coating layer onto at least a portion of a surface of a substrate;
   (III) curing the liquid precursor composition of step (II) to form a cured product;
   wherein the cured product has a carbon yield of at least 35 weight percent, when treated at 10° C./minute from 25° C. to 1,000° C. under an inert atmosphere, and disregarding the weight of the substrate and the optional components present in the composition; and
   (IV) carbonizing the cured product of step (III) to form a carbonized layered article.

2. The process of claim 1, wherein the product formed after the curing step (III) is in powder form.

3. The process of claim 1, wherein the product formed after the carbonizing step (IV) is in powder form.

4. The process of claim 1, wherein the liquid precursor composition is solvent-free.

5. The process of claim 4, wherein the liquid precursor composition comprises at least one divinylarene dioxide; and wherein the at least one divinylarene dioxide comprises divinylbenzene dioxide.

6. The process of claim 1, wherein the at least one aromatic co-reactive curing agent compound comprises a phenolic compound.

7. The process of claim 1, wherein the at least one aromatic co-reactive curing agent compound comprises p-cresol.

8. The process of claim 1, wherein the liquid precursor composition includes at least one cure catalyst.

9. The process of claim 1, including an additional epoxy resin different from the aromatic epoxy resin, an additional curing agent different from the aromatic co-reactive curing agent and the catalytic curing agent, a filler, a reactive diluent, a flexibilizing agent, a processing aid, a toughening agent, or a mixture thereof.

10. The process of claim 1, wherein the carbonizing step is carried out for a time sufficient to provide a carbon electrode.

11. A carbon electrode article prepared by the process of claim 1.

12. The carbon electrode article of claim 11, wherein the carbon electrode has an electrical resistivity of less than $10^{-2}$ Ω·cm.

13. The carbon electrode article of claim 11 comprising a carbon optically transparent electrode article.

14. The carbon optically transparent electrode article of claim 13, wherein the electrode has a transmittance of at least 20 percent.

* * * * *